(12) United States Patent
Dieckmann

(10) Patent No.: US 6,512,780 B1
(45) Date of Patent: Jan. 28, 2003

(54) SYSTEM FOR COMPENSATING DIRECTIONAL AND POSITIONAL FLUCTUATIONS IN LIGHT PRODUCED BY A LASER

(75) Inventor: Nils Dieckmann, Aalen (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 116 days.

(21) Appl. No.: 09/717,560

(22) Filed: Nov. 21, 2000

(30) Foreign Application Priority Data

Dec. 10, 1999 (DE) .................................. 199 59 742.1

(51) Int. Cl.⁷ .................................................. H01S 3/10
(52) U.S. Cl. .......................................................... 372/9
(58) Field of Search .............................................. 372/9

(56) References Cited

U.S. PATENT DOCUMENTS

| | | | |
|---|---|---|---|
| 3,869,210 A | * 3/1975 | Fletcher et al. | ............. 356/106 |
| 4,703,166 A | 10/1987 | Bruning | |
| 4,821,113 A | * 4/1989 | McQuade et al. | ............ 358/75 |
| 6,157,478 A | * 12/2000 | Naiki et al. | .................. 359/204 |
| 6,211,989 B1 | * 4/2001 | Wulf et al. | .................. 359/210 |
| 6,333,510 B1 | * 12/2001 | Watanabe et al. | ....... 250/559.27 |

FOREIGN PATENT DOCUMENTS

| | | |
|---|---|---|
| EP | 0 293 823 B1 | 6/1985 |
| JP | PCT/JP00/02761 | 4/2000 |

* cited by examiner

Primary Examiner—Paul Ip
Assistant Examiner—Leith A Al-Nazer
(74) Attorney, Agent, or Firm—Welsh & Katz, Ltd.

(57) ABSTRACT

A beam splitter (4) arranged in a laser beam (2) and at least two beam-deflecting devices (7) are provided in a system for at least far-reaching compensation of directional and positional fluctuations in the light beam (2) produced by a laser (1), in particular for micro lithographic illuminating devices. The beam splitter (4) guides a partial beam (2a) directly onto an illuminating reference surface (3) of the illuminating device, while a further partial beam (2b) is led back to the beam splitter (4) via a detour (5) in which the at least two beam-deflecting devices (6, 7) are located, and is subsequently likewise fed to the illuminating reference surface (3).

3 Claims, 1 Drawing Sheet

Figure 1:
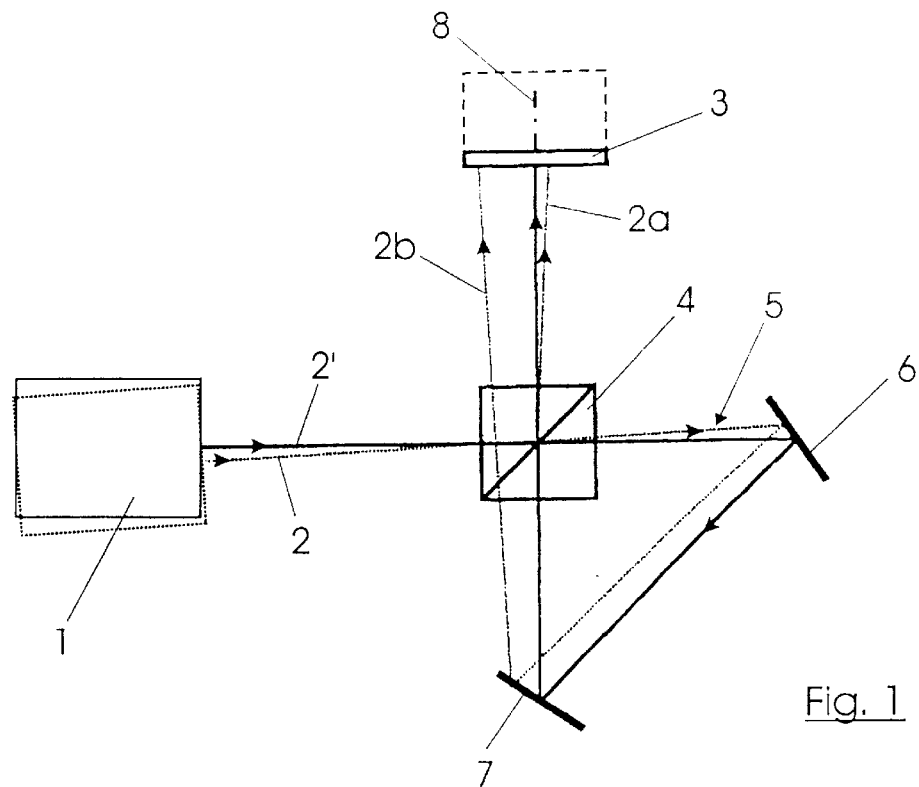

SYSTEM FOR COMPENSATING DIRECTIONAL AND POSITIONAL FLUCTUATIONS IN LIGHT PRODUCED BY A LASER

The invention relates to a system for at least far-reaching compensation of directional and positional fluctuations in light produced by a laser, in particular for micro lithographic illuminating devices. The invention also relates to a device therefore.

It is generally known to influence and vary light produced by a laser, in particular with reference to rotation and focusing. Reference may be made for this purpose to EP 293823 B1 and U.S. Pat. No. 4,703,166, for example. Both patent specifications relate to an active focusing sensor device, the aim being to tune the wavelength of a laser beam in order to find the magnitude of the spacing of the objective from a wafer. Active control is performed for this purpose by means of appropriate rotation of mirrors. At the same time, the aim in this case is also to compensate vibration al movements of a positioning table.

Laser-operated illuminating systems such as are used, for example, in micro lithographic projection exposure machines react sensitively to positional and directional fluctuations in the laser radiation at the input to the system. In particular, this exerts a negative influence on the uniformity of the light distribution and the centered beam angular characteristic (telecentrism). Again, it is not always possible to avoid positional and directional fluctuations while observing tolerances which are as small as possible. Thus, for example, changes occur simply from heating of the laser during operation.

It is therefore the object of the present invention to compensate as far as possible positional and directional fluctuations in light produced by a laser, in particular for micro lithographic illuminating devices which exert a negative influence on the uniformity of the light distribution and the characteristic of the centered beam angle.

This object is achieved according to the invention in systematic terms by means of the features named in claim 1.

A device for this purpose is exhibited in claim 3.

According to the invention, the laser beam produced by a laser is partitioned into two partial beams at a beam splitter between the laser and the illuminating system or the illuminating device, a first partial beam being guided directly onto an illuminating reference surface. The second partial beam is guided via a detour having at least two beam-deflecting devices, before subsequently also being fed to the illuminating reference surface after renewed traversal of the beam splitter.

The measure according to the invention renders it possible to balance fluctuations in the laser with reference to its position, and thus to eliminate their action on the illuminating system.

At the same time, the system according to the invention and the device therefore can also be used to achieve a compensation of directional fluctuations in the laser. Although a slight beam offset occurs in this case, in practice the beam offset is less than 1% of the beam width. It is important that the proposed system delivers stabilization of the centroid beam position and the centroid beam direction.

Since the beam splitter causes a plurality of round-trip passes by the partial beam guided via the beam-deflecting device, it can advantageously be provided for a more uniform light distribution that as regards the partition of the laser beam the splitting ratio of the first partial beam to the second partial beam is 33.3/66.7.

A beam splitter cube can advantageously be used as beam splitter, because this avoids a beam offset which would be produced by a beam splitter plate itself. The beam splitter cube has, of course, to be tuned to the wavelength employed.

Path-folding mirrors can be used in a simple way as beam-deflecting devices.

Figure 2:
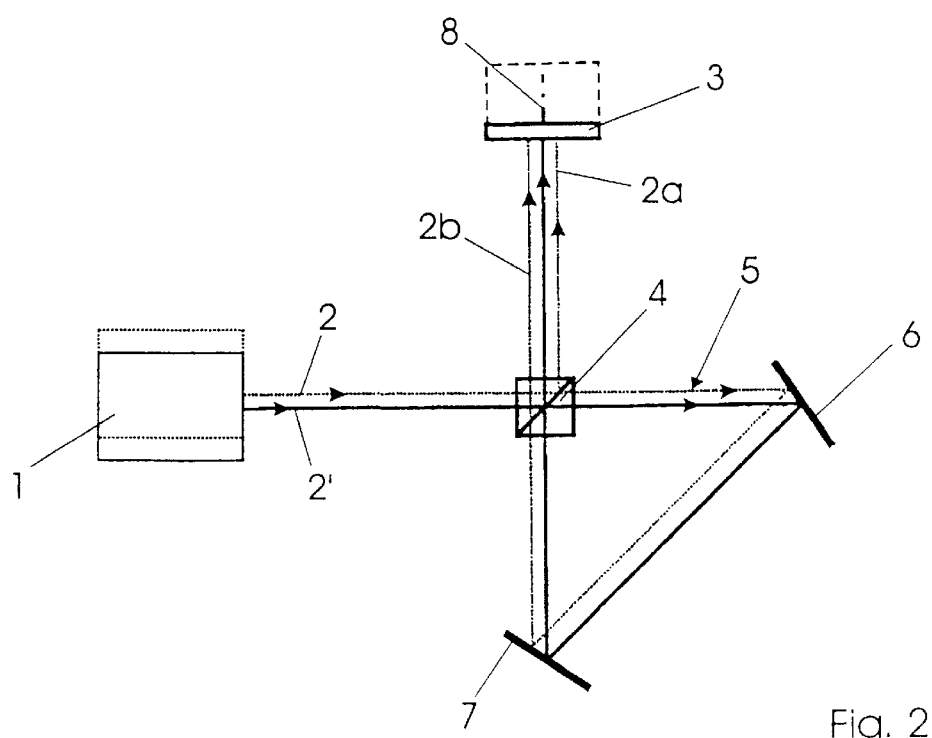

An exemplary embodiment is described in principle below with the aid of the drawing, in which:

FIG. 1 shows the course of a laser beam produced by a laser, with compensation of directional fluctuations, and FIG. 2 shows the course of a laser beam produced by a laser, with compensation of positional fluctuations.

A laser beam 2 is produced by a laser 1 (not illustrated in more detail). The laser beam 2 is illustrated, as a continuous line, as the optimum beam 2' in FIGS. 1 and 2, no directional and positional fluctuations at all being present. A maladjusted beam 2 is illustrated by dots in both figures. In practice, the optimum beam 2' cannot be implemented in this exact form. In the event of maladjustment of the beam 2 in conjunction with directional fluctuations in the laser (see FIG. 1), that is to say given an oblique position of the laser, an angular error occurs at an illuminating reference surface 3 in accordance with the deviations. In the case of known systems and devices, the illuminating reference surface 3 is generally located in the direct laser beam. The angular deviation is more strongly expressed the greater the spacing of the laser 1 from the illuminating reference surface 3.

In the case of a parallel offset of the laser 1 (FIG. 2), a parallel offset of the laser beam 2 occurs in the same way and likewise leads to a displacement of the laser beam 2 from the plane of symmetry.

The compensation of directional fluctuations in the laser 1 is illustrated in FIG. 1. A beam splitter 4 is located for this purpose in the beam path between the laser 1 and the illuminating device or the illuminating reference surface 3. At the beam splitter 4, the laser beam 2 striking it is partitioned into a first partial beam 2a, which is guided directly onto the illuminating reference surface 3, and into a further or second partial beam 2b, which is guided via a detour 5, in which at least two beam-deflecting devices 6 and 7 are located, in such a way that the deflected partial beam 2b is led once again to the beam splitter 4, from where it is subsequently also fed to the illuminating reference surface 3.

Since the further partial beam 2b generally repeatedly takes the path via the detour 5, a beam splitter, which can be a beam splitter cube 4, for example, is designed in such a way that the splitting ratio of the first partial beam, which is led directly to the illuminating reference surface 3, and the second partial beam 2b, which repeatedly takes the path via the detour 5, is 33.3/66.7.

As may be seen from FIG. 1, the beam splitter 4 in no way influences the optimum beam 2', because even the partial beam which takes the path via the detour and the two beam-deflecting devices designed as path-folding mirrors 6 and 7 strikes the illuminating reference surface 3 exactly in the plane of symmetry 8.

The course of a maladjusted laser beam 2 looks different, however, in this case. In the illustrated exemplary embodiment with the angular deviation prescribed by way of example, the partial beam 2a deflected by the beam splitter 4 is present slightly to the right next to the plane of symmetry 8 of the illuminating reference surface 3. The partial beam 2b, which has taken the path via the detour 5, correspondingly strikes the illuminating reference surface 3 to the left of the plane of symmetry 8. This means that by comparison with the partial beam 2a it is respectively situated on the other side of the plane of symmetry 8. As may be seen, this results in beam widening and a minimum beam offset, but these changes are so slight in practice that they are negligible. For reasons of clarity, the deviations of the laser beam 2 from the optimum laser beam 2' are also illustrated with great exaggeration in FIGS. 1 and 2. In practice, directional fluctuations occur which are smaller than 0.2 mrad. Parallel displacements which are addressed below with the aid of FIG. 2, have a maximum order of magnitude of 0.5 mm, which is likewise negligible given a beam diameter of 30 mm, in general.

It is important only that there is no change in the centroid direction. The centroid beam is to strike the illuminating reference surface 3 as far as possible perpendicularly. As a result, however, of the fact that now the partial beam 2a is situated to the right, and the partial beam 2b is situated to the left, of the plane of symmetry 8, resulting in the presence of corresponding deviations in the centroid beam, the mean value of the centroid beam, which has become somewhat wider, is once again, however, situated perpendicular to the illuminating reference surface 3. The directional fluctuations are thereby compensated in practice. This requires merely that the splitting ratio is skillfully selected such that both partial beams are of equal intensity, the result then being that one partial beam is exactly compensated by the other partial beam. As already mentioned, the slight offset occurring thereby plays no role in practice. The same holds likewise for the divergences of the beam, which become slightly larger.

The relationships in the case of compensation of positional fluctuation in the laser are even clearer, as is illustrated in FIG. 2. As may be seen, in this case the two partial beams 2a and 2b are situated symmetrically relative to the plane of symmetry 8. In this case, both partial beams strike the illuminating reference surface perpendicularly, and the symmetry is also retained. Only the width of the beam has become slightly larger, but this—as already mentioned—is negligible in practice by comparison with the beam diameter of the laser beam of 30 to 40 mm.

What is claimed is:

1. A system for compensation of directional and positional fluctuations in a light beam produced by a laser, defined by a beam splitter arranged in the laser beam and at least two beam-deflecting devices, said beam splitter splitting the laser beam in a splitting ratio of a first partial beam to a second partial beam of approximately 33.3/66.7, the beam splitter guiding said first partial beam directly onto an illuminating reference surface of the illuminating device, while said second partial beam is led back to the beam splitter via a detour in which the at least two beam-deflecting devices are located, and is subsequently led to the illuminating reference surface.

2. A device for compensation of directional and positional changes in a light beam produced by a laser for a micro lithographic illuminating device, wherein a beam splitter and at least two beam-deflecting devices, comprising path-folding mirrors are arranged between the laser and the illuminating device for the purpose of partitioning the laser beam into partial beams, the beam-deflecting devices being arranged in such a way that they lead the partial beam deflected by them back to the beam splitter.

3. The device as claimed in claim 2, wherein the beam splitter is designed as a beam splitter cube.

* * * * *